United States Patent
Sakashita et al.

(10) Patent No.: US 11,538,673 B2
(45) Date of Patent: Dec. 27, 2022

(54) SPUTTERING TARGET-BACKING PLATE ASSEMBLY

(71) Applicant: JX Nippon Mining & Metals Corporation, Tokyo (JP)

(72) Inventors: Ryosuke Sakashita, Ibaraki (JP); Yosuke Endo, Ibaraki (JP); Naoki Ise, Ibaraki (JP); Hiroshi Takamura, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 0 days.

(21) Appl. No.: 16/774,735

(22) Filed: Jan. 28, 2020

(65) Prior Publication Data

US 2020/0258724 A1 Aug. 13, 2020

(30) Foreign Application Priority Data

Feb. 12, 2019 (JP) .............................. JP2019-022220

(51) Int. Cl.
*H01J 37/34* (2006.01)
*C23C 14/34* (2006.01)

(52) U.S. Cl.
CPC ...... *H01J 37/3435* (2013.01); *C23C 14/3407* (2013.01)

(58) Field of Classification Search
CPC ..... B22F 7/064; B23K 35/0233; B23K 35/26; B23K 35/30; C23C 14/3407; H01J 37/3435
USPC ........................................ 204/298.12, 298.13
See application file for complete search history.

(56) References Cited

U.S. PATENT DOCUMENTS

| 5,945,227 | A | 8/1999 | Yamagami et al. |
| 9,062,371 | B2 | 6/2015 | Koido |
| 9,472,383 | B2 | 10/2016 | Okabe et al. |
| 10,006,117 | B2 | 6/2018 | Tsukamoto et al. |
| 10,354,846 | B2 | 7/2019 | Nagatsu et al. |
| 10,381,203 | B2 | 8/2019 | Takamura et al. |
| 2010/0038240 | A1* | 2/2010 | Simons ............... C23C 14/3407 204/298.13 |
| 2015/0357169 | A1* | 12/2015 | Yuan ..................... B23K 35/24 204/298.13 |
| 2018/0282859 | A1 | 10/2018 | Takamura et al. |

FOREIGN PATENT DOCUMENTS

| CN | 103264231 A | | 8/2013 |
| GB | 2053763 | * | 2/1981 |
| JP | H05-025620 A | | 2/1993 |
| JP | H07-080634 A | | 3/1995 |
| JP | H10-162309 A | | 6/1998 |
| JP | H10-241111 A | | 9/1998 |
| JP | 11-131225 | * | 5/1999 |
| JP | 2008-095204 | * | 4/2008 |
| JP | 2008-239381 A | | 10/2008 |

OTHER PUBLICATIONS

Machine Translation JP 11-131225 (Year: 1999).*
Machine Translation JP 2008-095204 (Year: 2008).*
Office Action dated Nov. 17, 2020 issued in corresponding Japanese (JP) Application No. 2019-022220.
Office Action dated Oct. 26, 2020 issued in corresponding Taiwanese (TW) Application No. 108142466.

* cited by examiner

*Primary Examiner* — Rodney G McDonald
(74) *Attorney, Agent, or Firm* — Howson & Howson LLP

(57) ABSTRACT

A sputtering target-backing plate assembly obtained by bonding a sputtering target and a backing plate using a brazing material, wherein a braze bonding layer which bonds the sputtering target and the backing plate contains a material having thermal conductivity that is higher than that of the brazing material in an amount of 5 vol % or more and 50 vol % or less, and a thickness of the braze bonding layer is 100 μm or more and 700 μm or less. An object is to prevent the seepage of the brazing material while maintaining the thickness of the braze bonding layer.

5 Claims, No Drawings

SPUTTERING TARGET-BACKING PLATE ASSEMBLY

BACKGROUND

The present disclosure relates to a sputtering target-backing plate assembly which is bonded via a brazing material.

A sputtering target is normally mounted on a deposition apparatus in a mode of being bonded with a backing plate configured from a material having high thermal conductivity, such as copper or copper alloy, in order to discharge the heat that is generated during sputtering. The method of bonding a sputtering target to a backing plate can be broadly classified into the following two methods. The first method is referred to as a diffusion bonding method in which is a method of performing heat treatment under high pressure and at a proper temperature, to a sputtering target material and a backing plate material, which have been stuck to each other in a vacuum, whereby both materials mutually diffuse and become bonded.

The second method is a brazing method (solder bonding method), which is a method of inserting, as a brazing material, a low-melting point material such as In or Sn alloy between a sputtering target and a backing plate, and thereby attaching and bonding the sputtering target and the backing plate. With the former diffusion bonding method, there are advantages in that it is clean because there is no need to interpose a material other than the target material and the backing plate material, and the heatproof temperature of the bonded part is higher in comparison to a case of using the brazing material of the latter method. Thus, the diffusion bonding method is suitable for high power sputtering, and is being applied to sputtering targets mainly made from a metal material such as Ti, Al, Cu, Ta, or Co.

Meanwhile, with regard to semiconductor materials such as silicon (Si) and germanium (Ge), and oxide materials such as PZT (Pb (Zr, Ti) $O_3$), $HfO_2$, $La_2O_3$, and MgO, diffusion bonding cannot be performed due to being the brittle materials and other issues on material characteristics. Thus, a sputtering target and backing plate are still joined using the brazing method. Normally, as the backing plate material, oxygen-free copper, copper alloy, and aluminum alloy which have high thermal conductivity and superior cooling efficiency are used, but other metal (alloy) materials are also used.

When bonding a target material having a low coefficient of thermal expansion, such as Si, via braze bonding, the brazing material is made thicker than usual to prevent the warping of the target. Nevertheless, when the target is used over a long period, there was a problem in that a part of the brazing material would melt due to the accumulation of heat, and the brazing material would seep out from the bonded interface of the target and the backing plate. In order to deal with the foregoing problem, while the brazing material may be thinned to a level where seepage will not occur, in such a case, a sufficient buffer effect of the brazing material cannot be exhibited, and there was a problem in that the warping of the target would increase.

As conventional technologies, Japanese Patent Application Publication No. H5-25620 describes that, when there is a difference in the thermal expansion coefficient between a target material, and a cooling member such as copper, by interposing a silver or copper foil as a buffer material in order to prevent the occurrence of warping during the bonding and cooling process, it is possible to mitigate the stress during the cooling process and prevent the occurrence of warping to an extent that there will be no hindrance in the mounting of the target material on the device. Japanese Patent Application Publication No. H5-25620 is a technique for preventing warping that occurs upon cooling the melted brazing material, and does not in any way offer any teaching regarding the seepage of the brazing material that occurs upon being used as a target.

Furthermore, Japanese Patent Application Publication No. 2008-239381 describes a bonding material for bonding at least two or more different types of members together, and teaches that the strength of the bonded part can be improved by uniformly dispersing an ITO (Indium-Tin-Oxide) powder within a brazing metal which is one among indium, indium alloy, and tin alloy. Nevertheless, Japanese Patent Application Publication No. 2008-239381 also offers no teaching in connection with the seepage of the brazing material in cases where the solder material is thickened, and, even if an ITO powder is dispersed in the brazing material, it is not possible to resolve the foregoing problem.

SUMMARY

When the brazing material is thickened to prevent the warping of the sputtering target, there was a problem in that a part of the brazing material becomes eluted due to the heat generated during sputtering, and the brazing material seeps out from the bonded interface. The seepage of the brazing material not only deteriorates the bonding strength, but it also adversely affects the quality of the product. In light of the above, an object of the present disclosure is to prevent the seepage of the brazing material while maintaining the thickness of the braze bonding layer.

In order to achieve the foregoing object, as a result of intense study, the present inventors discovered that, by including a material having high thermal conductivity in the brazing material or embedding such material in the brazing material, it is possible to increase the cooling efficiency during sputtering and prevent the seepage of the brazing material even when the braze bonding layer is thick. Based on the foregoing discovery, the present disclosure provides the following.

1) A sputtering target-backing plate assembly obtained by bonding a sputtering target and a backing plate using a brazing material, wherein a braze bonding layer which bonds the sputtering target and the backing plate contains a material having thermal conductivity that is higher than that of the brazing material in an amount of 5 vol % or more and 50 vol % or less, and a thickness of the braze bonding layer is 100 μm or more and 700 μm or less.

2) The sputtering target-backing plate assembly according to 1) above, wherein the material having high thermal conductivity is comprised of a metal powder having an average grain size ($D_{50}$) of 1.0 μm or more and 100 μm or less.

3) The sputtering target-backing plate assembly according to 1) above, wherein the material having high thermal conductivity is comprised of a metal foil having a thickness of 20 μm or more and 100 μm or less.

4) The sputtering target-backing plate assembly according to 3) above, wherein the metal foil is inserted as a single layer between the brazing materials, or laminated alternately with the brazing material.

5) The sputtering target-backing plate assembly according to 3) or 4) above, wherein the metal foil is inserted within the brazing material in an island shape or a ring shape.

6) The sputtering target-backing plate assembly according to 4) or 5) above, wherein, when the metal foil is inserted as a single layer between the brazing materials, an area ratio of an area of one surface of the metal foil relative to an area of a bonding surface of the sputtering target is 50% or higher and 100% or less.

7) The sputtering target-backing plate assembly according to 4) or 5) above, wherein, when the metal foil is laminated alternately with the brazing material, an area ratio of a total area of one surface of the metal foil relative to an area of a bonding surface of the sputtering target is 50% or higher and 400% or less.

8) The sputtering target-backing plate assembly according to any one of 1) to 7) above, wherein a diameter of the sputtering target is 420 mm or more.

9) The sputtering target-backing plate assembly according to any one of 1) to 8) above, wherein the sputtering target is made from a material having a thermal expansion coefficient of $1.0 \times 10^{-6}$/K or higher and $15 \times 10^{-6}$/K or less.

10) The sputtering target-backing plate assembly according to any one of 1) to 9) above, wherein the material having high thermal conductivity is comprised of copper, silver, gold, or an alloy thereof.

11) The sputtering target-backing plate assembly according to any one of 1) to 10) above, wherein the brazing material is comprised of indium or indium alloy.

12) The sputtering target-backing plate assembly according to any one of 3) to 11) above, wherein a surface of the metal foil is embossed.

Since the overall braze bonding layer has high thermal conductivity and the cooling efficiency is improved in the sputtering target-backing plate assembly of the present disclosure, the present disclosure yields a superior effect of being able to reduce the melting of the brazing material, and consequently prevent the outflow of the brazing material from the bonded interface of the sputtering target and the backing plate.

DETAILED DESCRIPTION

When bonding a sputtering target having a low coefficient of thermal expansion to a backing plate via brazing bonding, the brazing material is sometimes applied thickly to prevent the warping of the target. Nevertheless, for instance, when using indium as the brazing material, since the thermal conductivity of indium is low at a 82 W/m·K, when the brazing material is thick, there was a problem in that the cooling efficiency from the backing plate side is low, and the temperature of the sputtering target or the brazing material would tend to increase during sputtering.

In order to solve the foregoing problem, the present disclosure is based on a basic technical concept of introducing a material having high thermal conductivity into a brazing material which is used for bonding a sputtering target and a backing plate, and thereby improving the thermal conductivity while maintaining the buffer effect of a thick brazing material (braze bonding layer), reducing the temperature increase of the sputtering target and the brazing material during sputtering, and preventing the outflow of the brazing material. Note that, in this disclosure, since other materials are introduced into the brazing material, the overall bonding material between the sputtering target and the backing plate is referred to as a "braze bonding layer".

The present disclosure is particularly effective in a sputtering target having a low coefficient of thermal expansion to which the brazing material needs to be applied thickly. In particular, the present disclosure is effective when the sputtering target is made from a material having a low coefficient of thermal expansion of $15 \times 10^{-6}$/K or less relative to copper (coefficient of thermal expansion: $16.8 \times 10^{-6}$/K), copper alloy, or aluminum (coefficient of thermal expansion: $23 \times 10^{-6}$/K), or aluminum alloy which are used as a general backing plate material. As that kind of materials, considered may be single elements such as Si (coefficient of thermal expansion: $2.6 \times 10^{-6}$/K) and Ge (coefficient of thermal expansion: $6.1 \times 10^{-6}$/K), or compounds of these elements and chalcogenide elements or compounds of other metals and chalcogenide elements (including oxides such as $SiO_2$ and $Al_2O_3$, GST, etc.).

The thickness of the braze bonding layer is preferably set to 100 μm or more and 700 μm or less. If the thickness of the braze bonding layer is less than 100 μm, it is not possible to maintain the buffer effect of the braze bonding layer, and the target tends to become warped during sputtering. Meanwhile, when the thickness of the braze bonding layer exceeds 700 μm, heat will become accumulated in the brazing material during sputtering, and the risk of the brazing material melting will increase.

The present disclosure is characterized in containing a material having thermal conductivity that is higher than that of the brazing material, such as indium (82 W/m·K) or tin (67 W/m·K), in the braze bonding layer which bonds the sputtering target and the backing plate, and, consequently, since the thermal conductivity of the braze bonding layer will increase and the cooling efficiency is improved, it is possible to reduce the melting of the brazing material and prevent the outflow thereof in comparison to a case where only the brazing material is used. As a material having high thermal conductivity, for instance, copper (402 W/m·K), silver (429 W/m·K), gold (318 W/m·K), or their alloys can be listed. Note that the values of thermal conductivity described above have all been compared at around room temperature. Moreover, the braze bonding layer preferably contains a material having high thermal conductivity in an amount of 5 vol % or higher and 50 vol % or less. When this amount is less than 5 vol %, there are cases where the effect of preventing the elution of the brazing material and the effect of suppressing the warping of the target after bonding cannot be obtained. Meanwhile, when this amount exceeds 50 vol %, there are cases where the adhesion ratio of the brazing material decreases.

As the methods of introducing the foregoing material having high thermal conductivity, there are 1) a method of adding a metal powder such as a copper powder or a silver powder, and 2) a method of introducing a flexible metal foil such as a copper foil or a silver foil. With either method, it is possible to increase the thermal conductivity of the braze bonding layer in comparison to a case where only the brazing material is used. In the method of 1) above, the average grain size $D_{50}$ of the powder is preferably 1.0 μm or more and 100 μm or less. When the average grain size $D_{50}$ is less than 1.0 μm, the powders become aggregated and the uniform dispersion thereof becomes difficult. Meanwhile, when the average grain size $D_{50}$ exceeds 100 μm, the overlapping of grains will occur in the brazing material, and the adhesion ratio may decrease.

In the method of 2) above, a metal foil such as a silver foil or a copper foil may be inserted as a single layer between the brazing materials, or the brazing material and the foil may be laminated alternately (metal foils are inserted in the form of a laminae in the same manner as a mille-feuille). When the metal foil is inserted as a single layer, in addition to using a single foil, a plurality of foils may be used as a single layer. Similarly, when laminating the metal foils, a plurality of foils may be used within a single layer. For example, a plurality of foils in an island shape (any shape such as a circle or square may be used) or in a ring shape may be placed to increase the area ratio. When alternately laminating the brazing material and the metal foil, the part that comes into contact with the sputtering target and the backing plate will obviously include the brazing material for bonding the sputtering target and the backing plate. The thickness of the metal foil (1 layer) is preferably set to 20 µm or more and 100 µm or less. When the thickness of the metal foil is less than 20 µm, the handling thereof becomes difficult. Meanwhile, when the thickness of the metal foil exceeds 100 µm, the adhesion ratio of the brazing material may decrease.

Moreover, in the method of 2) above, when the metal foil is inserted as a single layer between the brazing materials, preferably, the area ratio of the area of the metal foil (one surface) relative to the area of the bonding surface of the sputtering target is 50% or higher and 100% or less. For instance, when the diameter of the sputtering target is φ400 mm and one copper foil having a diameter of φ360 mm is inserted, the area ratio will be 81% (=(180×180×π)/(200×200×π)×100). In other words, when the diameter of the sputtering target is φ400 mm, the area ratio being 50% means that the diameter of the copper foil is approximately φ228 mm, and the area ratio being 100% means that the diameter of the foil is the same as the diameter of the sputtering target.

Meanwhile, in the method of 2) above, when the metal foil is laminated alternately with the brazing material between the brazing materials, preferably, the area ratio of the area of the metal foil (total area when a plurality of metal foils are inserted) relative to the area of the bonding surface of the sputtering target is 50% or higher and 400% or less. For instance, when foils are introduced in the following manner; namely, In layer 120 µm/copper foil 70 µm/In layer 120 µm/copper foil 70 µm/In layer 120 µm, and the diameter of the sputtering target is set to φ400 mm and the diameter of the copper foil is set to φ360 mm, since the area ratio of one copper foil is 81%, when two copper foils are inserted in the manner described above, the area ratio of the total area will be 162%.

Moreover, in the method of 2) above, preferably, both surfaces of the metal foil have undergone surface treatment, and in particular embossing, which forms a regular concave-convex pattern, is preferably performed. It is thereby possible to improve the adhesion of the brazing material and the metal foil, and consequently improve the overall bonding strength of the braze bonding layer.

The brazing material may be any material that melts at a temperature that is lower than the melting point of the material configuring the sputtering target and the backing plate, and in particular In (indium), indium alloy, Sn (tin), or tin alloy is preferably used. However, the indium alloy or tin alloy described above, and indium or tin to which a copper or silver powder has been added, should be clearly differentiated. Moreover, the adhesion ratio can be increased by performing ultrasonic welder treatment or vapor deposition treatment after applying the brazing material to the sputtering target and the backing plate. While there is no particular limitation regarding the size of the sputtering target to which the present disclosure can be applied, since the problem of warping of the target becomes notable and the necessity of thickening the brazing material (braze bonding layer) will increase when the diameter of the sputtering target is 420 mm or more, the present disclosure is particularly effective in the foregoing case.

EXAMPLES

The present disclosure is now explained with reference to the following Examples and Comparative Examples. Note that the following Examples are merely illustrative, and the present disclosure shall in no way be limited thereby. In other words, the present disclosure is limited only by the scope of the claims, and various modifications other than the Examples are also covered by the present disclosure.

Example 1

Cu Powder 20 Vol %

An In brazing material, to which a copper powder having a grain size of 70 µm was mixed therein in an amount of 20 vol %, was applied to a Si sputtering target (φ444.7 mm) and an oxygen-free copper backing plate, and the target and the backing plate were thereby bonded. The thickness of the braze bonding layer was set to 500 µm. The warping of the target after the bonding was small with a convex of 0.18 mm, and the adhesion ratio based on ultrasonic flaw detection inspection was high at 99.7%, and adhesiveness was favorable. Next, as a simulation method of evaluating prolonged sputtering acceleratingly, the sputtering target side was heated for 3 minutes using a halogen lamp heater, and the backing plate was cooled at a water temperature of 20° C. to evaluate having or not having the elution of the brazing material. As a result, elution of the brazing material was not observed. The foregoing measurement of the warping of the sputtering target, measurement of the adhesion ratio, and elution evaluation of the brazing material were also performed in the same manner in the following Examples and Comparative Examples.

Example 2

Cu Powder 50 Vol %

An In brazing material, to which a copper powder having a grain size of 70 µm was mixed therein in an amount of 50 vol %, was applied to a Si sputtering target (φ444.7 mm) and an oxygen-free copper backing plate, and the target and the backing plate were thereby bonded. The thickness of the braze bonding layer was set to 500 µm. The warping of the target after the bonding was small with a convex of 0.15 mm, and the adhesion ratio was high at 99.4%, and adhesion was favorable. Next, as a result of conducting an elution evaluation test of the foregoing brazing material, elution of the brazing material was not observed.

Example 3

Cu Powder 50 Vol %, Thin Brazing Material

An In brazing material, to which a copper powder having a grain size of 70 µm was mixed therein in an amount of 50 vol %, was applied to a Si sputtering target (φ444.7 mm) and an oxygen-free copper backing plate, and the target and the backing plate were thereby bonded. The thickness of the braze bonding layer was set to 300 µm. The warping of the target after the bonding was small with a convex of 0.24 mm, and the adhesion ratio was high at 98.1%, and adhesiveness was favorable. Next, as a result of conducting an elution evaluation test of the foregoing brazing material, elution of the brazing material was not observed.

Example 4

Ag Powder 20 Vol %

An In brazing material, to which a silver powder having a grain size of 10 µm was mixed therein in an amount of 20 vol %, was applied to a Si sputtering target (φ444.7 mm) and an oxygen-free copper backing plate, and the target and the backing plate were thereby bonded. The thickness of the braze bonding layer was set to 300 μm. The warping of the target after the bonding was small with a convex of 0.20 mm, and the adhesion ratio was high at 99.2%, and adhesiveness was favorable. Next, as a result of conducting an elution evaluation test of the foregoing brazing material, elution of the brazing material was not observed.

Example 5

Fine Powder

An In brazing material, to which a copper powder having a grain size of 0.8 μm was mixed therein in an amount of 20 vol %, was applied to a Si sputtering target (φ114.7 mm) and an oxygen-free copper backing plate, and the target and the backing plate were thereby bonded. The thickness of the braze bonding layer was set to 500 μm. The warping of the target after the bonding was small with a convex of 0.23 mm, and the adhesion ratio decreased to 96.6%. Next, as a result of conducting an elution evaluation test of the foregoing brazing material, elution of the brazing material was not observed.

Example 6

Large Grain Size Powder

An In brazing material, to which a copper powder having a grain size of 200 μm was mixed therein in an amount of 20 vol %, was applied to a Si sputtering target (φ444.7 mm) and an oxygen-free copper backing plate, and the target and the backing plate were thereby bonded. The thickness of the braze bonding layer was set to 500 μm. The warping of the target after the bonding increased to a convex of 0.38 mm, and the adhesion ratio decreased to 91.3%. Meanwhile, as a result of conducting an elution evaluation test of the foregoing brazing material, elution of the brazing material was not observed. Note that the foregoing warping amount and adhesion ratio are within an acceptable range.

Comparative Example 1

Only Brazing Material

Only an In brazing material was applied to a Si sputtering target (φ444.7 mm) and an oxygen-free copper backing plate, and the target and the backing plate were thereby bonded. The thickness of the braze bonding layer was set to 500 μm. The warping of the target after the bonding increased to a convex of 0.48 mm. Next, as a result of conducting an elution evaluation test of the foregoing brazing material, elution of the brazing material was observed.

Comparative Example 2

Copper Powder Ratio 5 vol % or less

An In brazing material, to which a copper powder having a grain size of 70 μm was mixed therein in an amount of 3 vol %, was applied to a Si sputtering target (φ444.7 mm) and an oxygen-free copper backing plate, and the target and the backing plate were thereby bonded. The thickness of the braze bonding layer was set to 500 μm. The warping of the target after the bonding increased to a convex of 0.40 mm. Next, as a result of conducting an elution evaluation test of the foregoing brazing material, elution of the brazing material was observed.

Comparative Example 3

Copper Powder Ratio 50 vol % or Higher

An In brazing material, to which a copper powder having a grain size of 70 μm was mixed therein in an amount of 70 vol %, was applied to a Si sputtering target (φ444.7 mm) and an oxygen-free copper backing plate, and the target and the backing plate were thereby bonded. The thickness of the braze bonding layer was set to 500 μm. The warping of the target after the bonding was small with a convex of 0.25 mm, but the adhesion ratio decreased to 89.5%. Next, as a result of conducting an elution evaluation test of the foregoing brazing material, elution of the brazing material was not observed. However, the foregoing adhesion ratio is insufficient as the adhesion of the target and backing plate in order to be used as a target, and there is a possibility that the In brazing material will melt due to the deterioration in the cooling efficiency during sputtering, and cause the separation of the target.

The results of using a metal powder are summarized in Table 1.

TABLE 1

| | Overview | Detailed structure | Thickness of braze bonding layer | Volume ratio (vol %) | In seepage | Target warping after bonding | Adhesion rate |
|---|---|---|---|---|---|---|---|
| Example 1 | Cu powder 20 vol % | Brazing material material + copper powder (70 um) | 500 um | 20 vol % | None | 0.18 mm convex | 99.7% |
| Example 2 | Cu powder 50 vol % | Brazing material material + copper powder (70 um) | 500 um | 50 vol % | None | 0.15 mm convex | 99.4% |
| Example 3 | Cu powder 50 vol % + thin brazing material | Brazing material material + copper powder (70 um) | 300 um | 50 vol % | None | 0.24 mm convex | 98.1% |
| Example 4 | Ag powder 20 vol % | Brazing material material + silver powder (10 um) | 300 um | 20 vol % | None | 0.20 mm convex | 99.2% |
| Example 5 | Fine powder | Brazing material material + copper powder (0.8 um) | 500 um | 20 vol % | None | 0.23 mm convex | 96.6% |
| Example 6 | Large grain size powder | Brazing material material + copper powder (200 um) | 500 um | 20 vol % | None | 0.38 mm convex | 91.3% |
| Comparative Example 1 | Only brazing material | Only brazing material material | 500 um | 0 vol % | Observed | 0.48 mm convex | 99.8% |

TABLE 1-continued

|  | Overview | Detailed structure | Thickness of braze bonding layer | Volume ratio (vol %) | In seepage | Target warping after bonding | Adhesion rate |
|---|---|---|---|---|---|---|---|
| Comparative Example 2 | Metal powder ratio 5 vol % or less | Brazing material material + copper powder (70 um) | 500 um | 3 vol % | Observed | 0.40 mm convex | 99.5% |
| Comparative Example 3 | Metal powder ratio 50 vol % or more | Brazing material material + copper powder (70 um) | 500 um | 70 vol % | None | 0.25 mm convex | 89.5% |

Sputtering target material: Si;
Brazing material: In;
Backing plate material: OFC;
Target shape: φ444.7 mm

Example 7

Foil 2 Layers

A Si sputtering target (φ114.7 mm), an oxygen-free copper backing plate, and copper foils were prepared, a spacer of an intended thickness was thereafter disposed, and a first copper foil (φ400 mm) was placed. A more spacer was disposed thereon and then a second copper foil was placed, and a molten brazing material was thereafter poured therein to bond the target and the backing plate. The brazing material thickness (1 layer) was set to 120 μm, the foil material thickness (1 layer) was set to 70 μm, and the braze bonding layer thickness was set to 500 μm. The warping of the target after the bonding was small with a convex of 0.15 mm convex, and the adhesion ratio was high at 99.5%, and adhesiveness was favorable. Next, as a result of conducting an elution evaluation test of the foregoing brazing material, elution of the brazing material was not observed.

Example 8

Foil 3 Layers

A Si sputtering target (φ444.7 mm), an oxygen-free copper backing plate, and copper foils were prepared, a spacer of an intended thickness was thereafter disposed, and a first copper foil (φ400 mm) was placed. A more spacer was disposed thereon and then a second copper foil was placed, another spacer was disposed thereon and then a third copper foil was placed, and a molten brazing material was thereafter poured therein to bond the target and the backing plate. The brazing material thickness (1 layer) was set to 80 μm, the foil material thickness (1 layer) was set to 70 μm, and the braze bonding layer thickness was set to 530 μm. The warping of the target after the bonding was small with a convex of 0.09 mm convex, and the adhesion ratio was high at 99.3%, and adhesiveness was favorable. Next, as a result of conducting an elution evaluation test of the foregoing brazing material, elution of the brazing material was not observed.

Example 9

Large Diameter Foil 2 Layers

A Si sputtering target (φ114.7 mm), an oxygen-free copper backing plate, and copper foils were prepared, a spacer of an intended thickness was thereafter disposed, and a first copper foil (φ440 mm) was placed. A more spacer was disposed thereon and then a second copper foil was placed, and a molten brazing material was thereafter poured therein to bond the target and the backing plate. The brazing material thickness (1 layer) was set to 120 μm, the foil material thickness (1 layer) was set to 70 μm, and the braze bonding layer thickness was set to 500 μm. The warping of the target after the bonding was small with a convex of 0.13 mm convex, and the adhesion ratio was high at 98.1%, and adhesiveness was favorable. Next, as a result of conducting an elution evaluation test of the foregoing brazing material, elution of the brazing material was not observed.

Example 10

Foil 4 Layers

A Si sputtering target (φ444.7 mm), an oxygen-free copper backing plate, and copper foils were prepared, a spacer of an intended thickness was thereafter disposed, and a first copper foil (φ400 mm) was placed. A more spacer was disposed thereon and then a second copper foil was placed, another spacer was disposed thereon and then a third copper foil was placed, another spacer was disposed thereon and then a fourth copper foil was placed, and a molten brazing material was thereafter poured therein to bond the target and the backing plate. The brazing material thickness (1 layer) was set to 60 μm, the foil material thickness (1 layer) was set to 35 μm, and the braze bonding layer thickness was set to 440 μm. The warping of the target after the bonding was small with a convex of 0.09 mm convex, and the adhesion ratio was high at 98.3%, and adhesiveness was favorable. Next, as a result of conducting an elution evaluation test of the foregoing brazing material, elution of the brazing material was not observed.

Example 11

Thick Foil

A Si sputtering target (φ444.7 mm), an oxygen-free copper backing plate, and copper foils were prepared, a spacer of an intended thickness was thereafter disposed, and a first copper foil (φ400 mm) was placed. A more spacer was disposed thereon and then a second copper foil was placed, and a molten brazing material was thereafter poured therein to bond the target and the backing plate. The brazing material thickness (1 layer) was set to 90 μm, the foil material thickness (1 layer) was set to 105 μm, and the braze bonding layer thickness was set to 480 μm. The warping of the target after the bonding was small with a convex of 0.17 mm convex, and the adhesion ratio decreased to 94.5%. Meanwhile, as a result of conducting an elution evaluation test of the foregoing brazing material, elution of the brazing material was not observed. Note that the foregoing adhesion ratio is within an acceptable range.

Comparative Example 4

Foil Area Ratio Less Than 50%

A Si sputtering target (φ444.7 mm), an oxygen-free copper backing plate, and a copper foil were prepared, a spacer of an intended thickness was thereafter disposed, and a copper foil (φ400 mm) was placed, and a molten brazing material was thereafter poured therein to bond the target and the backing plate. The brazing material thickness (1 layer) was set to 210 µm, the foil material thickness (1 layer) was set to 70 µm, and the braze bonding layer thickness was set to 590 µm. The warping of the target after the bonding was large with a convex of 0.45 mm convex. As a result of conducting an elution evaluation test of the foregoing brazing material, elution of the brazing material was observed.

Comparative Example 5

Thin Foil

A Si sputtering target (φ444.7 mm), an oxygen-free copper backing plate, and copper foils were prepared, a spacer of an intended thickness was thereafter disposed, and a first copper foil (φ400 mm) was placed. A more spacer was disposed thereon and then a second copper foil was placed, and a molten brazing material was thereafter poured therein to bond the target and the backing plate. The brazing material thickness (1 layer) was set to 160 µm, the foil material thickness (1 layer) was set to 9 µm, and the braze bonding layer thickness was set to 498 µm. The warping of the target after the bonding was large with a convex of 0.46 mm convex. As a result of conducting an elution evaluation test of the foregoing brazing material, elution of the brazing material was observed.

Comparative Example 6

Thick Braze Bonding Layer

A Si sputtering target (φ444.7 mm), an oxygen-free copper backing plate, and copper foils were prepared, a spacer of an intended thickness was thereafter disposed, and a first copper foil (φ400 mm) was placed. A more spacer was disposed thereon and then a second copper foil was placed, another spacer was disposed thereon and then a third copper foil was placed, and a molten brazing material was thereafter poured therein to bond the target and the backing plate. The brazing material thickness (1 layer) was set to 120 µm, the foil material thickness (1 layer) was set to 105 µm, and the braze bonding layer thickness was set to 795 µm. The warping of the target after the bonding was small with a convex of 0.25 mm convex. Meanwhile, as a result of conducting an elution evaluation test of the foregoing brazing material, elution of the brazing material was observed.

The results of using a metal foil are summarized in Table 2.

TABLE 2

| | Overview | Detailed structure | Thickness of braze bonding layer |
|---|---|---|---|
| Example 7 | Foil 2 layers | Brazing material + copper foil + brazing material + copper foil + brazing material | 500 um |
| Example 8 | Foil 3 layers | Brazing material + copper foil + brazing material + copper foil + brazing material + copper foil + brazing material | 530 um |
| Example 9 | Large diameter foil 2 layers | brazing material + copper foil + brazing material + copper foil + brazing material | 500 um |
| Example 10 | Foil 4 layers | Brazing material + copper foil + brazing material + copper foil + brazing material + copper foil + brazing material + copper foil + brazing material | 440 um |
| Example 11 | Thick foil - Reduced adhesion rate | Brazing material + copper foil + brazing material + copper foil + brazing material | 480 um |
| Comparative Example 4 | Foil area ratio 50% or less | Brazing material + copper foil + brazing material | 590 um |
| Comparative Example 5 | Thin foil - Reduced warping suppression effect | Brazing material + copper foil + brazing material + copper foil + brazing material | 498 um |
| Comparative Example 6 | Thick brazing material (800 um) | Brazing material + copper foil + brazing material + copper foil + brazing material + copper foil + brazing material | 795 um |

| | Volume ratio (vol %) | Brazing material thickness (1 layer) | Foil diameter | Foil material thickness (1 layer) | Area ratio | In seepage | Target warping after bondng | Adhesion rate |
|---|---|---|---|---|---|---|---|---|
| Example 7 | 23% | 120 um | φ400 | 70 um | 162% | None | 0.15 mm convex | 99.5% |
| Example 8 | 32% | 80 um | φ400 | 70 um | 243% | None | 0.09 mm convex | 99.3% |
| Example 9 | 27% | 120 um | φ440 | 70 um | 196% | None | 0.13 mm convex | 98.1% |
| Example 10 | 31% | 60 um | φ440 | 35 um | 324% | None | 0.09 mm convex | 98.3% |
| Example 11 | 43% | 90 um | φ400 | 105 um | 162% | None | 0.17 mm convex | 94.5% |
| Comparative Example 4 | 2% | 210 um | φ200 | 70 um | 20.2% | Observed | 0.45 mm convex | 99.8% |

TABLE 2-continued

| | | | | | | | | |
|---|---|---|---|---|---|---|---|---|
| Comparative Example 5 | 3% | 160 um | φ400 | 9 um | 162% | Observed | 0.46 mm convex | 97.2% |
| Comparative Example 6 | 32% | 120 um | φ400 | 105 um | 243% | Observed | 0.25 mm convex | 97.5% |

Sputtering target material: Si;
Brazing material: In;
Backing plate material: OFC,
Target shape: φ444.7 mm Since the overall braze bonding layer has high thermal conductivity and the cooling efficiency is improved in the sputtering target-backing plate assembly of the present disclosure, the present disclosure yields a superior effect of being able to reduce the melting of the brazing material, and consequently prevent the outflow of the brazing material from the bonded interface of the sputtering target and the backing plate. The present disclosure is particularly effective upon bonding a sputtering target made from a semiconductor material such as silicon (Si) or germanium (Ge), or an oxide material such as PZT ($Pb(Zr, Ti)O_3$), $HfO_2$, $La_2O_3$, or MgO.

We claim:

1. A sputtering target-backing plate assembly obtained by bonding a sputtering target and a backing plate using a brazing material, wherein a braze bonding layer bonds the sputtering target to the backing plate and contains the brazing material and 5 vol % or more and 50 vol % or less of a material having thermal conductivity that is higher than that of the brazing material, a thickness of the braze bonding layer being 100 μm or more and 700 μm or less, and wherein the material having thermal conductivity that is higher than that of the brazing material consists of a metal powder having an average grain size ($D_{50}$) of 1.0 μm or more and 100 μm or less.

2. The sputtering target-backing plate assembly according to claim 1, wherein a diameter of the sputtering target is 420 mm or more.

3. The sputtering target-backing plate assembly according to claim 1, wherein the sputtering target is made from a material having a thermal expansion coefficient of $1.0 \times 10^{-6}$/K or higher and $15 \times 10^{-6}$/K or less.

4. The sputtering target-backing plate assembly according to claim 1, wherein the material having thermal conductivity is comprised of copper, silver, gold, or an alloy thereof.

5. The sputtering target-backing plate assembly according to claim 1, wherein the brazing material is comprised of indium or indium alloy.

* * * * *